(12) United States Patent
Chien

(10) Patent No.: US 7,273,385 B2
(45) Date of Patent: Sep. 25, 2007

(54) HOLDING DEVICE FOR HOLDING A TESTED ELECTRONIC MODULE

(76) Inventor: Hsin-Feng Chien, No. 57-16, Yung-Fang Rd., Ta-Liao Hsiang, Kaohsiung Hsien (TW)

( * ) Notice: Subject to any disclaimer, the term of this patent is extended or adjusted under 35 U.S.C. 154(b) by 0 days.

(21) Appl. No.: 11/353,414

(22) Filed: Feb. 14, 2006

(65) Prior Publication Data
US 2006/0128211 A1    Jun. 15, 2006

Related U.S. Application Data

(63) Continuation-in-part of application No. 11/076,799, filed on Mar. 10, 2005, now abandoned.

(30) Foreign Application Priority Data
Sep. 15, 2004   (TW) .............................. 93214721 U

(51) Int. Cl.
*H01R 4/60* (2006.01)
(52) U.S. Cl. ..................................................... 439/197
(58) Field of Classification Search ................ 439/197, 439/260, 42, 41
See application file for complete search history.

(56) References Cited

U.S. PATENT DOCUMENTS

| | | | |
|---|---|---|---|
| 3,090,026 A | 5/1963 | Raddin | |
| 3,757,219 A * | 9/1973 | Aksu | 324/758 |
| 4,061,969 A * | 12/1977 | Dean | 324/761 |
| 5,181,853 A | 1/1993 | Van Brunt et al. | |
| 5,622,505 A | 4/1997 | Hashiguchi et al. | |
| 6,071,137 A | 6/2000 | Rutilgiano | |

* cited by examiner

*Primary Examiner*—Phuong Dinh
(74) *Attorney, Agent, or Firm*—McNees Wallace & Nurick LLC

(57) ABSTRACT

A holding device includes first and second walls, an adapter card, a deformable sheet member, a set of contact pads, and a force-imparting unit. The first and second walls define an accommodating space, and an insertion space that is reduced in width from the accommodating space. The adapter card extends into the accommodating space through the insertion space. The deformable sheet member has a first end portion that is secured to the first wall, and a second end portion that is sandwiched securely between the adapter card and the first wall. The contact pads are attached to the deformable sheet member. The force-imparting unit is operable so as to impart a pushing force on the deformable sheet member for elastically deforming the deformable sheet member to a contact position, where the contact pads are flush with a planar surface of the adapter card.

6 Claims, 6 Drawing Sheets

HOLDING DEVICE FOR HOLDING A TESTED ELECTRONIC MODULE

CROSS-REFERENCE TO RELATED APPLICATION

This application is a continuation-in-part (CIP) of U.S. patent application Ser. No. 11/076,799, filed on Mar. 10, 2005 now abandoned.

BACKGROUND OF THE INVENTION

1. Field of the Invention

The invention relates to a holding device, more particularly to a holding device for holding an electronic module that is to be tested by a testing apparatus.

2. Description of the Related Art

FIG. 1 illustrates a conventional holding device that includes a pair of opposing walls 211, a clamping unit 22, a pair of electrical connectors 23, and a hydraulic driving unit 24. With further reference to FIG. 2, the conventional holding device serves to hold a dual in-line memory module (DIMM) 1 that is to be tested by a testing apparatus (not shown). The DIMM 1 includes a printed circuit board, a plurality of integrated circuits mounted on the printed circuit board, and a set of contact pins 13 that are disposed along an end of the printed circuit board and that are coupled electrically to the integrated circuits. The walls 211 define an accommodating space 213 therebetween. The end of the printed circuit board is disposed in the accommodating space 213 when the DIMM 1 is held between the walls 211. The clamping unit 22 is disposed in the accommodating space 213, and includes a pair of clamps 221 that are operable so as to clamp the end of the printed circuit board of the DIMM 1.

Each of the electrical connectors 23 has first and second ends, each of which is provided with a set of electrical contacts 232, 233. The first end of each of the electrical connectors 23 is connected detachably to a respective one of the clamps 221 of the clamping unit 22. The electrical contacts 233 on the second end of the electrical connectors 23 are connected electrically to the testing apparatus. The hydraulic driving unit 24 controls the operation of the clamps 221 of the clamping unit 22. As illustrated in FIG. 3, the electrical contacts 232 of each of the electrical connectors 23 are respectively in contact with the contact pins 13 of the DIMM 1 when the clamps 221 of the clamping unit 22 are operated by the hydraulic driving unit 24 to clamp the printed circuit board of the DIMM 1, thereby permitting the testing apparatus to perform tests on the DIMM 1.

Although the aforementioned conventional holding device achieves its intended purpose, the hydraulic driving unit 24 generates undesirable noise. Moreover, since the electrical contacts 232 of the electrical connectors 23 are brought into contact with the contact pins 13 of the DIMM 1 by means of clamping, the first ends of the electrical connectors 23 are easily damaged, thereby requiring frequent replacement of the electrical connectors 23. Further, since the DIMM 1 is subjected to high temperatures during soldering of the integrated circuits on the printed circuit board, deformation of the DIMM 1 occurs. As such, since the clamps 221 of the clamping unit 22 are rigid, the electrical contacts 232 of the electrical connectors 23 may not be properly brought into contact with the contact pins 13 of the deformed DIMM 1, thereby making the test results inaccurate.

In U.S. Pat. No. 6,071,137, there is disclosed a conventional holding device that addresses the above-mentioned problems. The conventional holding device includes opposing first and second walls, a deformable sheet member, a plurality of contact elements, and a force-imparting unit. The first and second walls define an accommodating space for extension of a DIMM thereinto. The deformable sheet member has a first end that is connected to the first wall, and a second end that is opposite to the first end of the deformable sheet member and that is coupled to the first wall through a pivoting member. The contact elements are attached to the deformable sheet member and are coupled electrically to a testing apparatus. The force-imparting unit is mounted on the first wall, is in fluid communication with the accommodating space, and is operable so as to impart a pushing force on the deformable sheet member for elastically deforming the deformable sheet member to a contact position, where the contact elements are respectively brought into contact with the contact pins of the DIMM, thereby permitting the testing apparatus to perform tests on the DIMM.

However, the aforementioned conventional holding device is disadvantageous in that, since the second end of the deformable sheet member is coupled to the first wall through the pivoting member, the deformable sheet member swings along with the pivoting member when the pushing force imparted by the force-imparting unit on the deformable sheet member. As such, the contacts elements may be misaligned with the contact pins of the DIMM, thereby obtaining inaccurate test results. In addition, a high precision is required to manufacture the conventional holding device so as to mitigate the aforesaid misalignment drawback, thereby resulting in relatively high manufacturing costs.

SUMMARY OF THE INVENTION

Therefore, the object of the present invention is to provide a holding device that can overcome the aforesaid drawbacks of the prior art.

According to the present invention, a holding device, which serves to hold removably an electronic module that is to be tested by a testing apparatus, comprises first and second walls, an adapter card, a deformable sheet member, a set of contact pads, and a force-imparting unit. The first and second walls define an accommodating space that is adapted for extension of the electronic module thereinto, and an insertion space that is reduced in width from the accommodating space. The adapter card extends into the accommodating space through the insertion space, has a planar surface that faces the first wall, and is adapted to be coupled electrically to the testing apparatus. The deformable sheet member has a first end portion that is secured to the first wall, and a second end portion that is opposite to the first end portion of the deformable sheet member, that extends into the insertion space, and that is sandwiched securely between the planar surface of the adapter card and the first wall. The contact pads are attached to the deformable sheet member, and are adapted to be coupled electrically to the testing apparatus. The force-imparting unit includes a force-imparting member that is provided on the first wall, and that is operable so as to impart a pushing force on the deformable sheet member for elastically deforming the deformable sheet member to a contact position, where the contact pads are flush with the planar surface of the adapter card and are adapted to establish contact with contact pins of the electronic module that is extended into the accommodating space, thereby permitting the testing apparatus to perform tests on the electronic module.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
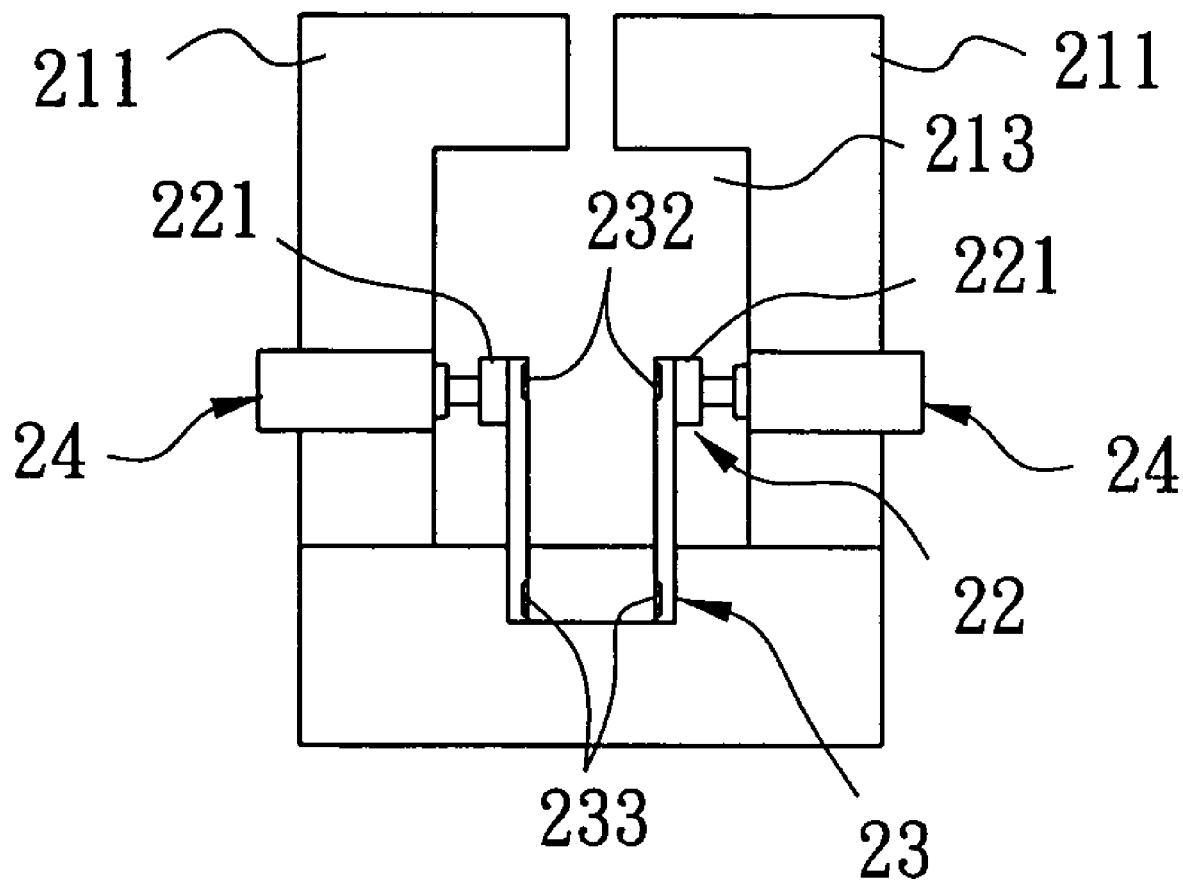
FIG. 1 is a schematic view of a conventional holding device.
Figure 2:
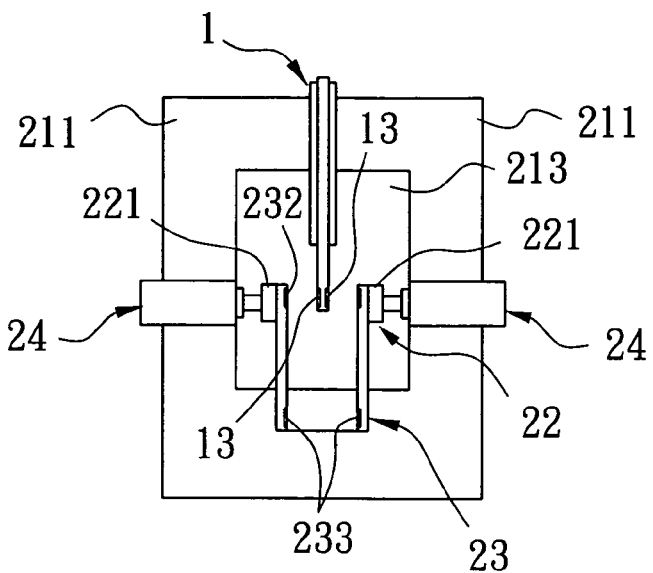
FIGS. 2 and 3 are schematic views of the conventional holding device in a state of use.
Figure 3:
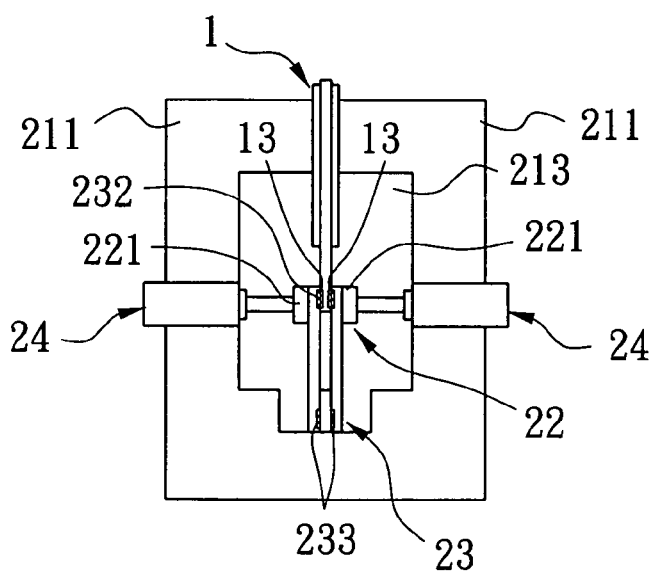

Before the present invention is described in greater detail, it should be noted that like elements are denoted by the same reference numerals throughout the disclosure.

Figure 4:
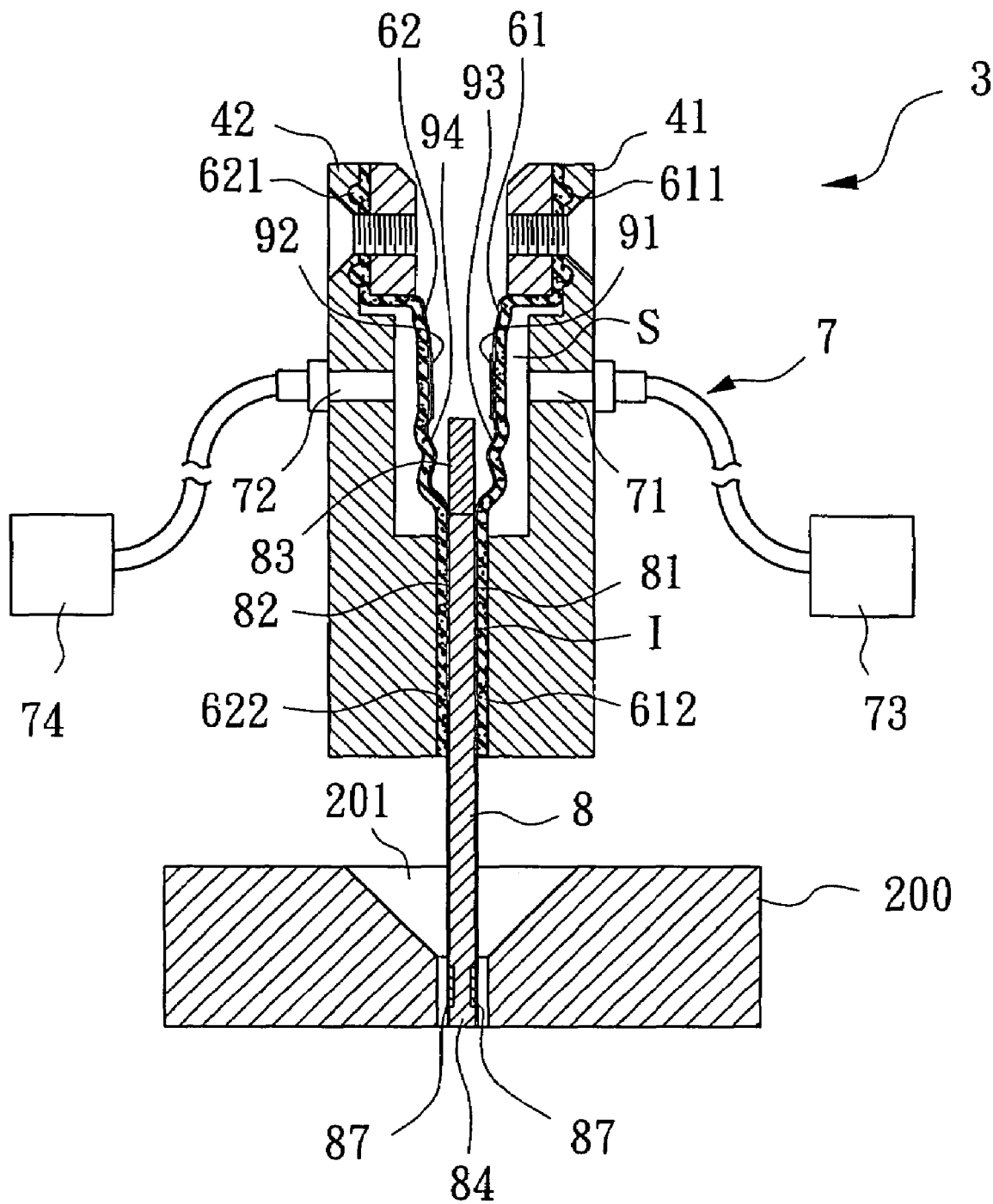
FIG. 4 is a fragmentary sectional view of the first preferred embodiment of a holding device according to the present invention.
Figure 5:
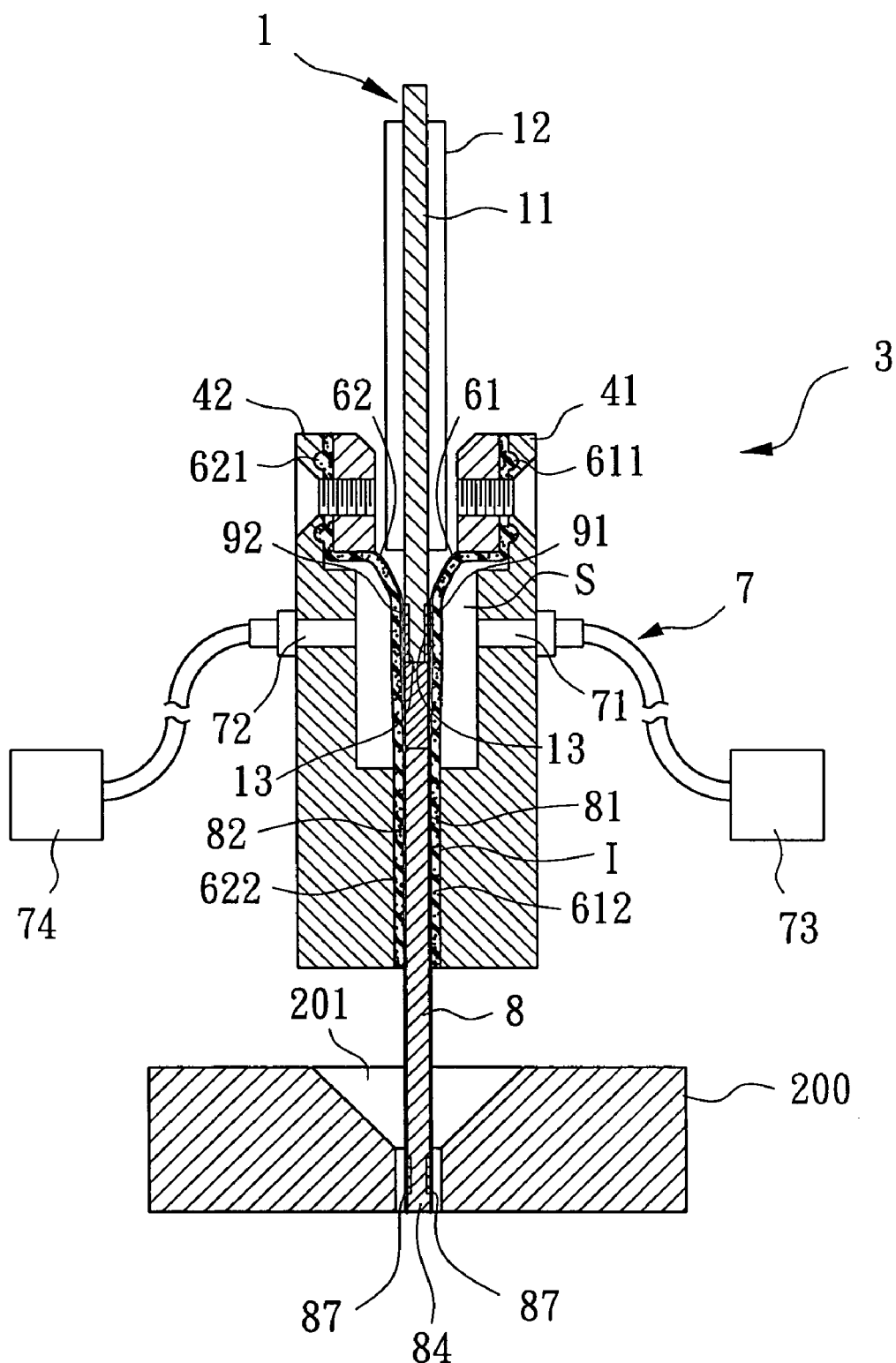
FIGS. 5 and 6 are fragmentary sectional views of the first preferred embodiment in a state of use.

Referring to FIGS. 4 and 5, the first preferred embodiment of a holding device 3 according to this invention is shown to include first and second walls 41, 42, an adapter card 8, first and second deformable sheet members 61, 62, a set of first contact pads 91, a set of second contact pads 92, and a force-imparting unit 7.

The holding device 3 of this embodiment serves to hold removably an electronic module 1 that is to be tested by a testing apparatus.

The electronic module 1 includes a printed circuit board 11, a plurality of integrated circuits 12 mounted on the printed circuit board 11, and a set of contact pins 13 that are provided along an end of the printed circuit board 11 and that are coupled electrically to the integrated circuits 12. In this embodiment, the electronic module 1 is a dual in-line memory module (DIMM).

The testing apparatus is installed with test software for executing tests on the electronic module 1, and includes a main board 200 that is provided with an insertion slot 201.

The first and second walls 41, 42 define an accommodating space (S) for extension of the electronic module 1 thereinto, and an insertion space (I) that is reduced in width from the accommodating space (S).

The end of the printed circuit board 11 of the electronic module 1 is disposed in the accommodating space (S) when the electronic module 1 is held between the first and second walls 41, 42.

The adapter card 8 extends into the accommodating space (S) through the insertion space (I), and has opposite first and second planar surfaces 81, 82, opposite first and second ends 83, 84, and a set of contact pins 87. Each of the first and second planar surfaces 81, 82 of the adapter card 8 faces a respective one of the first and second walls 41, 42. The first end 83 of the adapter card 8 is disposed in the accommodating space (S), and abuts against the end of the printed circuit board 11 of the electronic module 1. The contact pins 87 of the adapter card 8 are provided along the second end 84 of the adapter card 8, and are in contact with electrical contacts (not shown) provided in the insertion slot 201 of the main board 200 of the testing apparatus when the second end 84 of the adapter card 8 is inserted into the insertion slot 201 of the main board 200 of the testing apparatus.

The first deformable sheet member 61 has a first end portion 611 that is secured to the first wall 41, and a second end portion 612 that is opposite to the first end portion 611 of the first deformable sheet member 61, that extends into the insertion space (I), and that is sandwiched securely between the first planar surface 81 of the adapter card 8 and the first wall 41. Similarly, the second deformable sheet member 62 has a first end portion 621 that is secured to the second wall 42, and a second end portion 622 that is opposite to the first end portion 621 of the second deformable sheet member 62, that extends into the insertion space (I), and that is sandwiched securely between the second planar surface 82 of the adapter card 8 and the second wall 42. In this embodiment, each of the first and second deformable sheet members 61, 62 is made from a plastic material.

The first contact pads 91 are attached securely to the first deformable sheet member 61, whereas the second contact pads 92 are attached securely to the second deformable sheet member 62.

The holding device 3 further includes a first conductive member 93 that couples electrically the first contact pads 91 to the main board 200 of the testing apparatus, and a second conductive member 94 that couples electrically the second contact pads 92 to the main board 200 of the testing apparatus. Preferably, each of the first and second conductive members 93, 94 is a ribbon connector.

The force-imparting unit 7 includes first and second force-imparting members. In this embodiment, the first force-imparting member of the force-imparting unit 7 is a first pneumatic driving member, and includes a first nozzle 71 and a first pneumatic controller 73. The first nozzle 71 of the first force-imparting member is provided on the first wall 41 and is in fluid communication with the accommodating space (S). The first pneumatic controller 73 of the first force-imparting member is operatively coupled to the first nozzle 71 of the first force-imparting member. Similarly, the second force-imparting member of the force-imparting unit 7 is a second pneumatic driving member, and includes a second nozzle 72 and a second pneumatic controller 74. The second nozzle 72 of the second force-imparting member is provided on the second wall 42 and is in fluid communication with the accommodating space (S). The second pneumatic controller 74 of the second force-imparting member is operatively coupled to the second nozzle 72 of the second force-imparting member. In this embodiment, each of the first and second pneumatic controllers 73, 74 includes a Venturi tube.

As best shown in FIG. 5, the first pneumatic controller 73 of the first force-imparting member is operable so as to impart a pushing force, such as by blowing, on the first deformable sheet member 61 through the first nozzle 71 of the first force-imparting member for elastically deforming the first deformable sheet member 61 from a first initial position to a first contact position, where the first contact pads 91 are flush with the first planar surface 81 of the adapter card 8 and establish contact with the contact pins 13 of the electronic module 1 in the accommodating space (S). Moreover, the second pneumatic controller 74 of the second force-imparting member is operable so as to impart a pushing force, such as by blowing, on the second deformable sheet member 62 through the second nozzle 72 of the second force-imparting member for elastically deforming the second deformable sheet member 62 from a second initial position to a second contact position, where the second contact pads 92 are flush with the second planar surface 82 of the adapter card 8 and establish contact with the contact pins 13 of the electronic module 1 in the accommodating space (S). At this time, the testing apparatus is able to perform tests on the electronic module 1.

It is noted that when the first and second deformable sheet members 61, 62 are in the first and second initial positions, respectively, as best shown in FIG. 4, the first and second contact pads 91, 92 are not in contact with the contact pins 13 of the electronic module 1 (see FIG. 5). Moreover, when the first and second deformable sheet members 61, 62 are in the first and second contact positions, respectively, as best shown in FIG. 5, each of the first and second deformable sheet members 61, 62 lays flat on the end of the printed circuit board 11 of the electronic module 1. As such, the contacts between the first and second contact pads 91, 92, and the contact pins 13 of the electronic module 1 can be ensured so that accurate test results can be obtained.

Figure 6:
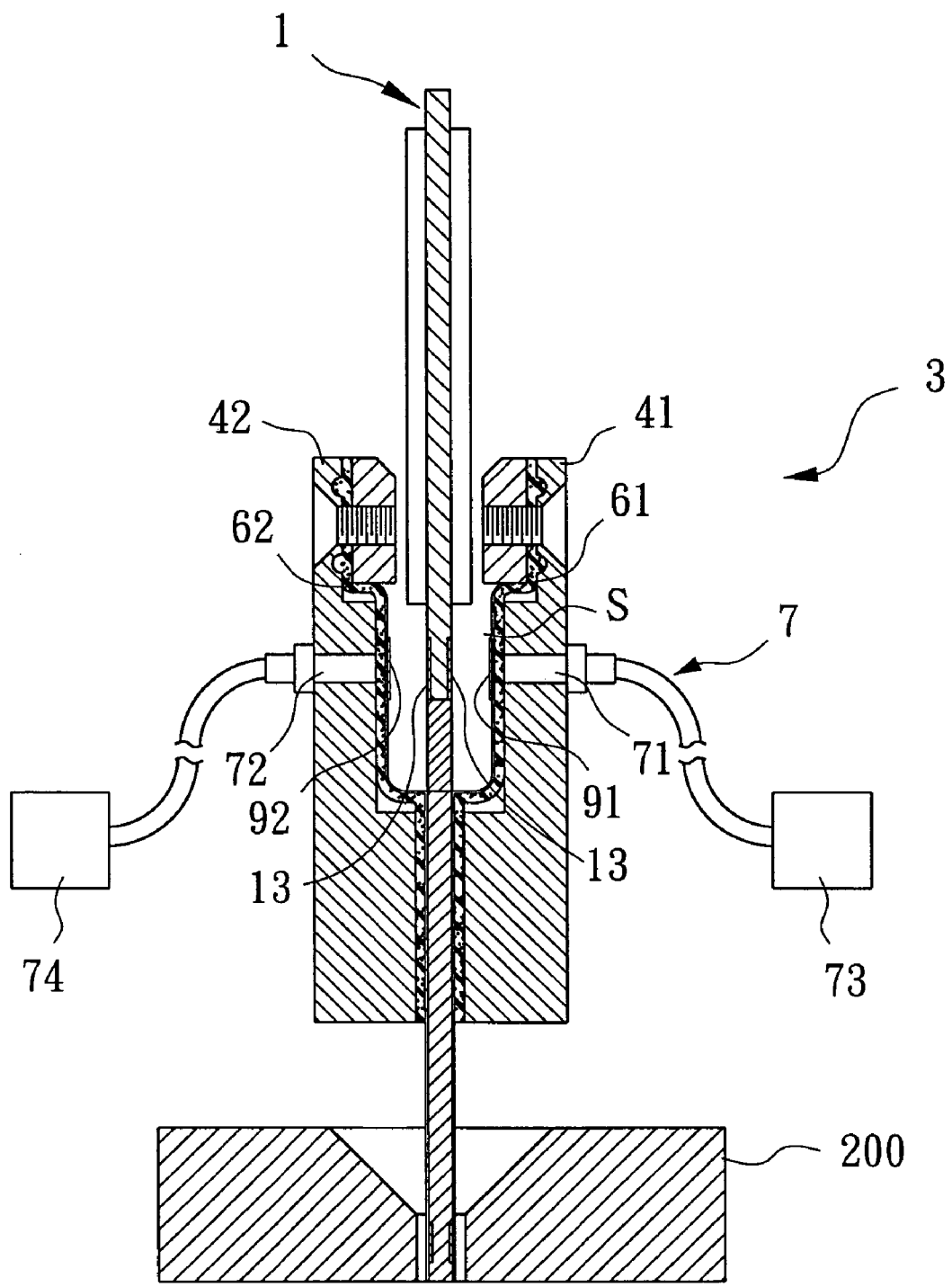

In this embodiment, with further reference to FIG. 6, the first pneumatic controller 73 of the first pneumatic driving member is further operable so as to impart a pulling force, such as by suction, on the first deformable sheet member 61 through the first nozzle 71 for elastically deforming the first deformable sheet member 61 from the first initial position to a first non-contact position, where the first contact pads 91 are unable to establish contact with the contact pins 13 of the electronic module 1. Moreover, the second pneumatic controller 74 of the second pneumatic driving is further operable so as to impart a pulling force, such as by suction, on the second deformable sheet member 62 through the second nozzle 72 for elastically deforming the second deformable sheet member 62 from the second initial position to a second non-contact position, where the second contact pads 92 are unable to establish contact with the contact pins 13 of the electronic module 1 in the accommodating space (S).

It is noted that when the first and second deformable members 61, 62 are disposed at the first and second non-contact positions, respectively, the electronic module 1 may be replaced by another electronic module 1. In another embodiment, when replacing the electronic module 1, the force-imparting unit 7 is simply disabled so as to dispose the first and second deformable sheet members 61, 62 at the first and second initial positions, respectively.

Figure 7:
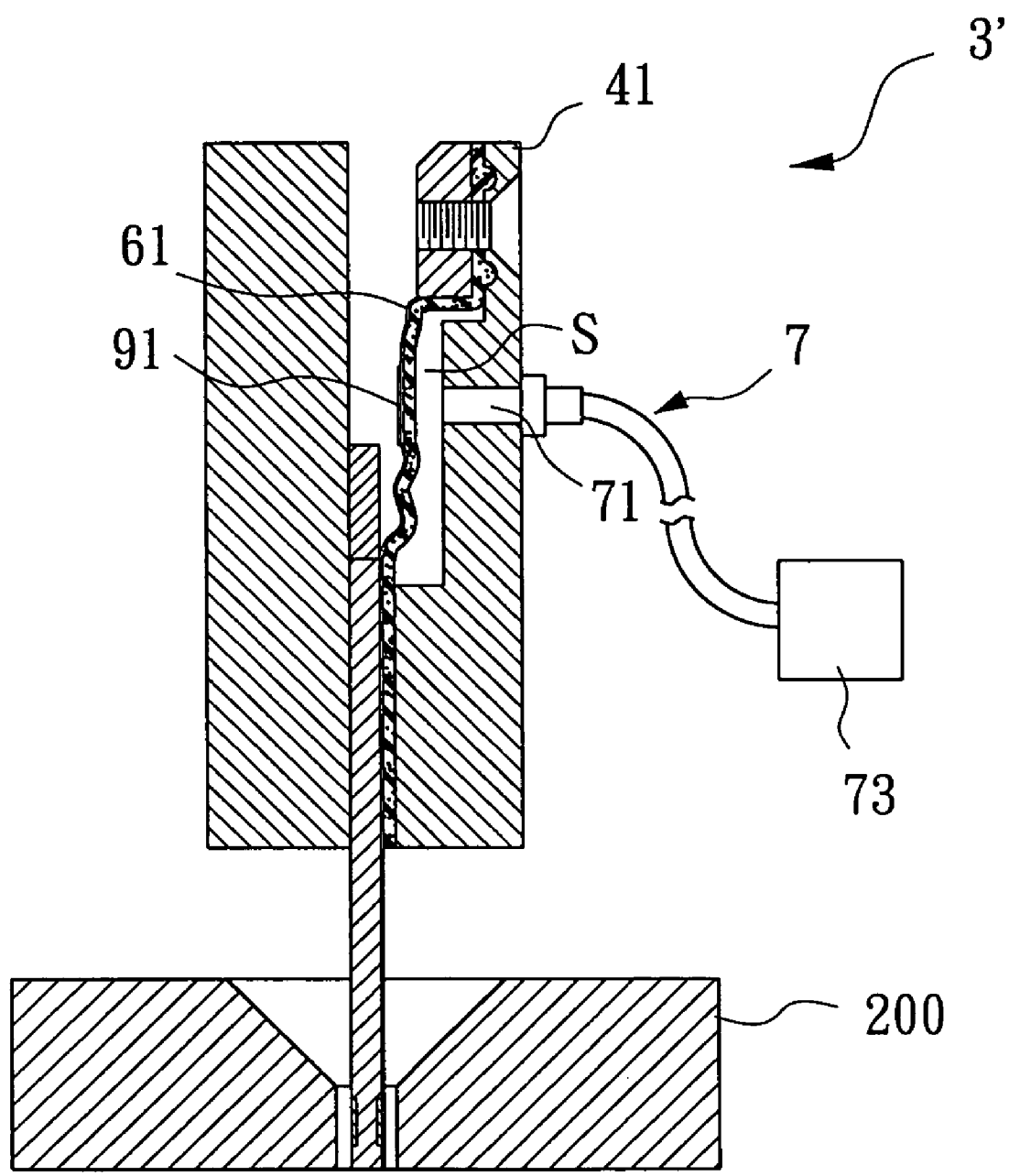
FIG. 7 is a fragmentary sectional view of the second preferred embodiment of a holding device according to the present invention.

FIG. 7 illustrates the second preferred embodiment of a holding device 3' according to this invention. When compared to the previous embodiment, the holding device 3' of this embodiment serves to hold a single in-line memory module (SIMM) (not shown). As such, the holding device 3' of this embodiment is dispensed with the second deformable sheet member 42 (see FIG. 4), the second contact pads 92 (see FIG. 4), and the second nozzle 72 (see FIG. 4) and the second pneumatic controller 74 (see FIG. 4) of the pneumatic driving unit 7.

Since the operation of the holding device 3' of this embodiment is similar to that described hereinabove in connection with the holding device 3 of the previous embodiment, a detailed description of the same will be dispensed with herein for the sake of brevity.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A holding device for holding removably an electronic module that is to be tested by a testing apparatus, said holding device comprising:
   first and second walls defining an accommodating space that is adapted for extension of the electronic module thereinto, and an insertion space that is reduced in width from said accommodating space;
   an adapter card extending into said accommodating space through said insertion space, having a first planar surface that faces said first wall, and adapted to be coupled electrically to the testing apparatus;
   a first deformable sheet member having a first end portion that is secured to said first wall, and a second end portion that is opposite to said first end portion of said first deformable sheet member, that extends into said insertion space, and that is sandwiched securely between said first planar surface of said adapter card and said first wall;
   a set of first contact pads attached to said first deformable sheet member, and adapted to be coupled electrically to the testing apparatus; and
   a force-imparting unit including a first force-imparting member that is provided on said first wall, and that is operable so as to impart a pushing force on said first deformable sheet member for elastically deforming said first deformable sheet member to a first contact position, where said first contact pads are flush with said first planar surface of said adapter card and are adapted to establish contact with contact pins of the electronic module that is extended into said accommodating space, thereby permitting the testing apparatus to perform tests on the electronic module.

2. The holding device as claimed in claim 1, wherein said first force-imparting member of said force-imparting unit is a first pneumatic driving member for elastically deforming said first deformable sheet member by blowing, said first pneumatic driving member including a first nozzle that is in fluid communication with said accommodating space, and a first pneumatic controller that is operatively coupled to said first nozzle.

3. The holding device as claimed in claim 2, wherein said first pneumatic driving member of said force-imparting unit is further operable so as to impart a pulling force on said first deformable sheet member for elastically deforming said first deformable sheet member to a first non-contact position, where said first contact pads are unable to establish contact with the contact pins of the electronic module that is extended into said accommodating space.

4. The holding device as claimed in claim 2, wherein said adapter card further has a second planar surface that is opposite to said first planar surface, said holding device further comprising:
   a second deformable sheet member having a first end portion that is secured to said second wall, and a second end portion that is opposite to said first end portion of said second deformable sheet member, that extends into said insertion space, and that is sandwiched securely between said second planar surface of said adapter card and said second wall; and
   a set of second contact pads attached to said second deformable sheet member, and adapted to be coupled electrically to the testing apparatus;
   said force-imparting unit further including a second force-imparting member that is provided on said second wall, and that is operable so as to impart a pushing force on said second deformable sheet member for elastically deforming said second deformable sheet member to a second contact position, where said second contact pads are flush with said second planar surface of said adapter card and are adapted to establish contact with the contact pins of the electronic module that is extended into said accommodating space.

5. The holding device as claimed in claim 4, wherein said second force-imparting member of said force-imparting unit is a second pneumatic driving member for elastically deforming said second deformable sheet member by blowing, said second force-imparting member including a second nozzle that is in fluid communication with said accommodating space, and a second pneumatic controller that is operatively coupled to said second nozzle.

6. The holding device as claimed in claim 5, wherein said second pneumatic driving member of said force-imparting unit is further operable so as to impart a pulling force on said second deformable sheet member for elastically deforming said second deformable sheet member to a second non-contact position, where said second contact pads are unable to establish contact with the contact pins of the electronic module that is extended into said accommodating space.

* * * * *